(12) United States Patent
Boisvert (10) Patent No.: US 6,587,143 B1
(45) Date of Patent: Jul. 1, 2003

(54) CORRELATED DOUBLE SAMPLER WITH SINGLE AMPLIFIER

(75) Inventor: David M. Boisvert, Windham, NH (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/233,018

(22) Filed: Jan. 19, 1999

(51) Int. Cl.[7] .................. H04N 5/217; H04N 9/64
(52) U.S. Cl. ........................ 348/241; 348/243
(58) Field of Search .................. 348/241–251; 358/463; 330/9

(56) References Cited

U.S. PATENT DOCUMENTS

| | | | | |
|---|---|---|---|---|
| 4,287,441 | A | 9/1981 | Smith ..................... | 307/353 |
| 5,034,633 | A | 7/1991 | Stekelenburg ........... | 307/352 |
| 5,086,344 | A | 2/1992 | D'Luna et al. .......... | 358/213.15 |
| 5,276,508 | A | 1/1994 | Boisvert et al. ......... | 358/48 |
| 5,329,312 | A | 7/1994 | Boisvert et al. ......... | 348/256 |
| 5,572,155 | A | 11/1996 | Tamayama ............. | 327/94 |
| 5,736,886 | A * | 4/1998 | Mangelsdorf et al. ... | 348/241 |
| 5,754,056 | A | 5/1998 | Sauer ..................... | 324/679 |
| 5,757,440 | A | 5/1998 | Mangelsdorf ........... | 348/697 |
| 6,346,968 | B1 * | 2/2002 | Domer et al. ........... | 348/223 |

OTHER PUBLICATIONS

*ISSCC96 Session (Feb. 9, 1996), Paper FA 11.5: A CMOS Front-End for CCD CameRAS*, Mangelsdorf, Chris; Nakamura, Katsu; Ho, Stacy; Brooks, Todd; Nishio, Kenichi & Matsumoto, Hiroaki.

*IEEE Journal of Solid–State Circuits*, vol. 31, No. 12, Dec. 1996, *A 2.5–V, 12–b, 5–MSample/s Pipelined CMOS ADC*, Yu, Paul C. & Lee, Hae–Seung, pp. 1854–1861.

* cited by examiner

Primary Examiner—Wendy R. Garber
Assistant Examiner—Catherine Toppin
(74) Attorney, Agent, or Firm—Girard & Equitz LLP (57) ABSTRACT

A correlated double sampler (CDS) circuit having a ping/pong architecture which employs only a single amplifier, and a CCD image sensor output processing circuit including such a CDS circuit and preferably also an analog-to-digital converter for processing the output of the CDS circuit and a black level correction feedback loop. In one cycle of operation (during processing of the raw output of a CCD sensor), the CDS circuit receives a first set of control signals followed by a second set of control signals, its output signal in response to the first set is indicative of the value of one pixel of a sensed image, and its output signal in response to the second set is indicative of the value of the next pixel of the image. Preferably, each set of control signals consists of a clamp signal, a sample signal, and a hold signal. Since the output signal of the CDS circuit has the same offset voltage for all pixels of an image, black level correction can be implemented using only one black level correction feedback loop. Use of a single amplifier (rather than two) and one black level correction loop (rather than two) reduces power consumption. Preferably, the amplifier of the CDS circuit produces a differential output so that the CDS circuit has a better power supply rejection ratio than do conventional CDS circuits. Also preferably, the invention is implemented with CMOS technology as an integrated circuit or portion of an integrated circuit.

21 Claims, 4 Drawing Sheets

FIG. 3 — CCD Output Sign (reset level, signal level)

FIG. 4 — Clamp 1 (ping)

FIG. 5 — Sample 1 (ping)

FIG. 6 — Hold 1 (ping)

FIG. 7 — Clamp 2 (pong)

FIG. 8 — Sample 2 (pong)

FIG. 9 — Hold 2 (pong)

CORRELATED DOUBLE SAMPLER WITH SINGLE AMPLIFIER

BACKGROUND OF THE INVENTION

1. Field of the Invention

The present invention relates to circuitry for preliminary processing of the raw output signal from a CCD image sensor. More particularly, the invention is (or includes) a correlated double sampler circuit including a single amplifier, having ping-pong architecture, and capable of processing a raw output signal from a CCD image sensor to generate an analog signal indicative of the value of each pixel of a sensed image.

2. Description of the Related Art

CCD (charge coupled device) image sensors are widely used to convert images into electronic signals that can be captured, transmitted, stored and displayed. Camcorders and digital still cameras typically use CCDs.

Figure 3:
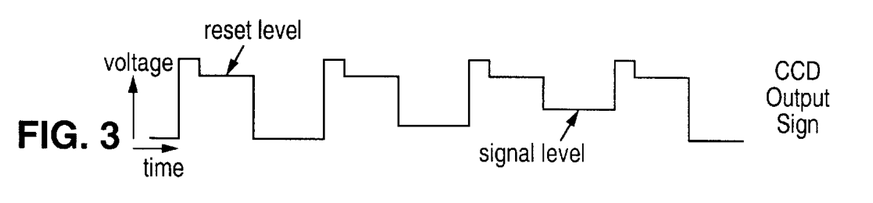
FIG. 3 is a diagram of the waveform of a raw output signal of a CCD image sensor (which is processed by the FIG. 2 circuit).

A CCD divides an image into a large number of discrete cells or pixels. The raw output signal produced by a CCD image sensor has a waveform of the type shown in FIG. 3. The FIG. 3 signal is a series of discrete analog voltage levels. The high voltage level (which immediately precedes the low level portion of each cycle) is commonly called the "reset level", while the lower voltage level is commonly called the "signal level", as indicated in FIG. 3. The difference between a signal level and its preceding reset level indicates the amount of light (typically of a particular color) that has fallen on one particular pixel of the image sensor.

One characteristic of CCDs is that each reset level is slightly different from the others due to noise. For this reason, it is important to quantify the difference between the signal level and its preceding reset level; not the absolute value of the signal level. It is common practice in systems that use CCDs to employ a circuit called a correlated double sampler (CDS) to sample and hold the difference between these two voltage levels (for each pixel of the sensed image).

Figure 1:
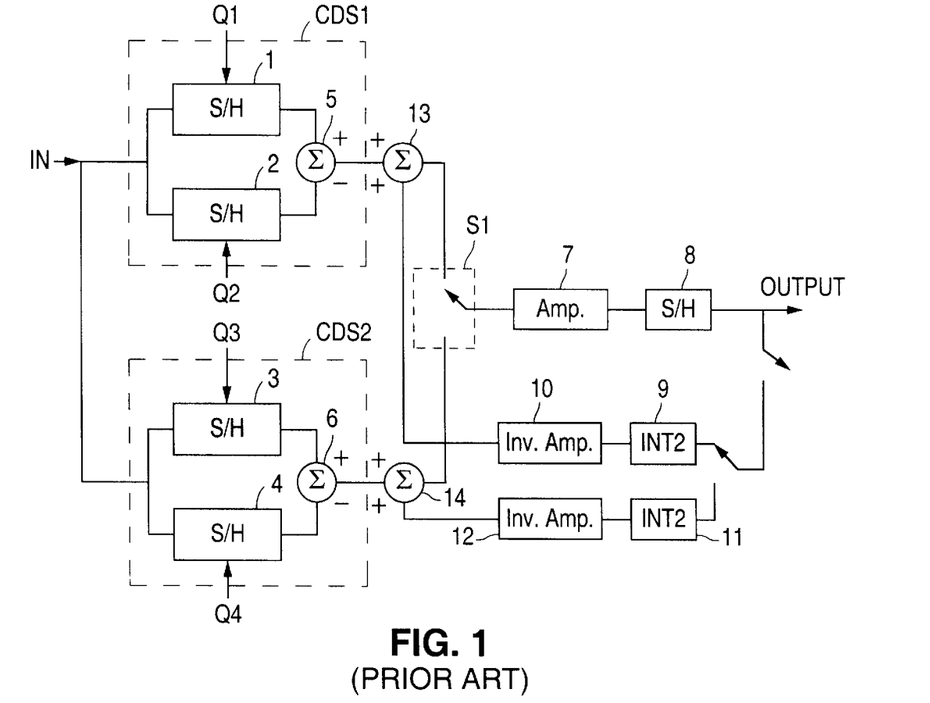
FIG. 1 is a block diagram of a conventional circuit, including two CDS circuits (CDS1 and CDS2), for preliminary processing of the raw output signal (labeled "IN") of a CCD image sensor.

FIG. 1 is a simplified block diagram of a conventional circuit, which includes two CDS circuits (CDS1 and CDS2) and has "ping-pong" architecture," for preliminary processing of the raw output signal (labeled "IN") of a CCD image sensor. The expression "ping-pong architecture" denotes that the FIG. 1 circuit is configured and controlled to process consecutive samples (of the signal IN) at the rate of one sample per clock cycle, with CDS2 processing every even sample and CDS1 processing every odd sample. This architecture provides an efficient solution to the problem of how to accomplish three sequential functions (clamp, sample, and hold) in response to two clock edges only per clock cycle. Another advantage of this architecture is that the hold cycle during which amplifier PGA takes the difference between the reset level and signal level (of a single sampled pixel) and presents this difference as output signal OUT can be a full clock cycle long.

It is well known to implement correlated double samplers (CDS's). For example, the AD9801 integrated circuit product manufactured by Analog Devices, implements the FIG. 1 circuit, which in turn includes two CDS's (CDS1 and CDS2). This implementation of the FIG. 1 circuit is described in C. Mangelsdorf, et al., "A CMOS Front-End for CCD Cameras," Paper FA 11.5, Proceedings of the 1996 IEEE International Solid-State Circuits Conference (pp. 146–147 and 186–187).

In FIG. 1, CDS1 includes circuitry implementing identical sample and hold circuits 1 and 2 and subtraction unit 5, the circuits 1 and 2 being connected in parallel between the input node and subtraction unit 5. CDS2 includes circuitry implementing identical sample and hold circuits 3 and 4 (which are identical to circuits 1 and 2) and subtraction unit 6, the circuits 3 and 4 being connected in parallel between the input node and subtraction unit 6. Each of circuits CDS1 and CDS2 is a sample and hold amplifier (which consumes power and has an offset value). Switch S1 selectively passes the output of CDS1 or CDS2 to amplifier 7, and the output of amplifier 7 is asserted to sample and hold circuit 8. The amplified signal output from amplifier 7 (the "OUTPUT" signal) is typically asserted by circuit 8 to an analog-to-digital converter (not shown).

Elements 9, 10, and 13 (connected as shown) comprise a black level correction loop for CDS1, and elements 11, 12, and 14 (connected as shown) comprise a black level correction loop for CDS2. Each black level correction loop provides feedback to set the output voltage OUTPUT to a known value for CCD pixel outputs of zero value (black).

The difference between portions of the OUTPUT signal indicative of black pixels (i.e., corresponding to masked portions of the CCD sensor) which have been processed by CDS1, and a desired output signal, are integrated in integration circuit 9. The output of circuit 9 is amplified in inverse amplifier 10 (whose gain is the inverse of amplifier 7's gain) and fed back to one input of addition unit 13, and unit 13 adds the output of amplifier 10 to the output of unit 5 being asserted to the other input of unit 13. The difference between portions of the OUTPUT signal indicative of black pixels which have been processed by CDS2, and a desired output signal, are integrated in integration circuit 11 (which is identical to circuit 9). The output of circuit 11 is amplified in inverse amplifier 12 (whose gain is the inverse of amplifier 7's gain) and fed back to one input of addition unit 14, and unit 14 adds the output of amplifier 10 to the output of unit 6 being asserted to the other input of unit 14.

In each of correlated double samplers CDS1 and CDS2, three functions must be executed during each clock cycle: sampling of the reset level, sampling of the signal level, and taking the difference between the two samples. The ping/pong approach, in which every odd sample of input signal IN (i.e., the first sample, the third sample, and so on) is processed by a first (ping) amplifier CDS1 and every even sample is processed by a second (pong) amplifier CDS2, is an efficient solution to the problem of how to accomplish the three sequential functions in response to only two clock edges per amplifier per clock cycle.

Figure 1A:
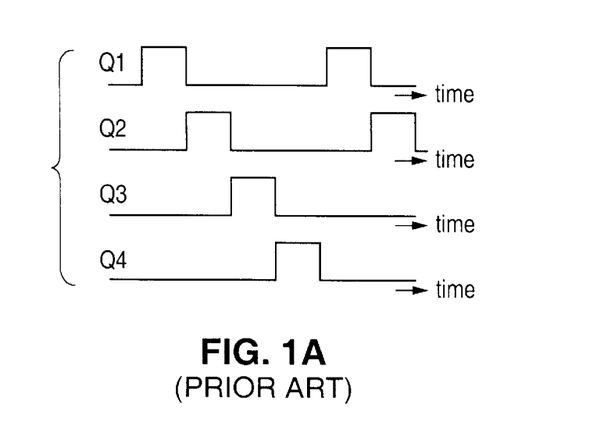
FIG. 1A is a timing diagram of the waveforms of several control signals asserted during operation of the FIG. 1 circuit.

Waveforms of the periodic control signals needed to operate the circuit of FIG. 1 are shown in FIG. 1A. On the falling edge of control signal Q1, CDS1 samples the input signal IN and asserts this sample (which is the sampled reset level) to subtraction unit 5. On the falling edge of control signal Q2, CDS1 again samples the input signal IN and asserts this sample (which is the sampled signal level) to subtraction unit 5, and a control signal (not shown) is asserted to switch S1 to cause switch S1 to couple the output of CDS1 to amplifier 7. Then, while switch remains in this state, CDS2 samples the input signal IN on the falling edge of control signal Q3 and asserts this sample (which is the sampled reset level for the next pixel) to subtraction unit 6. Then, on the falling edge of control signal Q4, CDS2 again samples the input signal IN and asserts this sample (which is the sampled signal level for the same pixel) to subtraction unit 6, and another control signal (not shown) is asserted to switch S1 to cause switch S1 to couple the output of CDS2 to amplifier 7 (thereby decoupling the output of CDS1 from amplifier 7). An advantage of the FIG. 1 implementation is that the hold cycle during which each of amplifiers CDS1 and CDS2 takes the different between a reset level and a signal level and presents this difference as an output signal (through switch S1 to amplifier 7) is a full clock cycle in duration (such a full clock consists of a half cycle in which Q1 is high and a half cycle in which Q2 is high, or a half cycle in which Q3 is high and a half cycle in which Q4 is high).

A problem with the FIG. 1 circuit is that each of sample and hold amplifiers CDS1 and CDS2 has its own offset voltage. Since each of CDS1 and CDS2 has a different offset voltage, two separate black level correction loops must be employed, one for each of circuits CDS1 and CDS2.

Another problem with conventional implementations of the FIG. 1 circuit is that the outputs of each of circuits CDS1 and CDS2 is referenced to ground (single ended). As a result, the FIG. 1 circuit has a poor power supply rejection ratio (PSRR).

U.S. Pat. Nos. 5,757,440 and 5,736,886 disclose implementations of the FIG. 1 circuit and variations thereon. For example, FIG. 8 of U.S. Pat. No. 5,757,440 discloses a variation on the FIG. 1 circuit which has ping-pong architecture and includes four sample and hold circuits (96, 98, 100, and 102) and a single subtraction element ("difference element" 127). However, there is no suggestion in either reference that a circuit having ping-pong architecture (for preliminary processing of a CCD image sensor's raw output) should be implemented to include only a single amplifier (having a single offset), and no suggestion as to how to implement such a single amplifier circuit.

It is known to implement a pipelined circuit to include a single operational amplifier ("op amp") which is shared between adjacent stages of the pipelined circuit, and to implement other circuits including such a shared op amp. See, for example, Yu and Lee, "A 2.5-V, 12-b, 5-MSample/s Pipelined CMSO ADC," IEEE Journal of Solid-State Circuits, Vol. 31, No. 12 (December 1996), pp. 1854–1861.

However, until the present invention, such an amplifier sharing technique has not been applied to a circuit implementing a CDS function for CCD processing applications (e.g., to overcome the limitations and disadvantages of conventional CDS circuits such as that described above with reference to FIG. 1).

SUMMARY OF THE INVENTION

In a class of preferred embodiments, the invention is a correlated double sampler (CDS) circuit having a ping/pong architecture, which includes only a single active amplifier (and thus a single offset voltage associated with the amplifier). In another class of embodiments, the invention is a CCD image sensor output processing circuit including such a CDS circuit. The CDS circuit includes capacitor and switch circuitry (comprising switches and capacitors, but not an amplifier) coupled between the input node (at which the raw CCD sensor output is received), the input of the amplifier, and the output of the amplifier.

In one cycle of operation during processing of the raw output of a CCD image sensor, the CDS circuit receives a first set of control signals followed by a second set of control signals, its output signal in response to the first set of control signals is indicative of the value of one pixel of a sensed image, and its output signal in response to the second set of control signals is indicative of the value of the next pixel of the image. In preferred implementations, each set of control signals consists of a clamp signal, a sample signal, and a hold signal. Since the output signal of the CDS circuit has the same offset voltage for all pixels of an image (including both even and odd pixels), black level correction can be implemented using only one black level correction feedback loop. Use of a single amplifier (rather than two or more amplifiers as in the prior art) and one black level correction loop (rather than two black level correction loops) reduces power consumption.

In preferred implementations, the amplifier of the inventive CDS circuit is an op amp which produces a differential output and therefore has a better power supply rejection ratio than does the prior art.

Preferably, the invention is implemented with CMOS technology as an integrated circuit (or portion of an integrated circuit).

The inventive circuit preferably has a continuous differential output. In operating the circuit, it is not important to cancel amplifier offset since the entire signal chain is in an offset adjusting feedback loop. It is important to keep the offset the same for every input signal sample (including samples of even pixels and samples of odd pixels) to avoid "even sample"-to-"odd sample" offset differences, and to minimize power consumption.

BRIEF DESCRIPTION OF THE DRAWINGS

Each of FIGS. 4–9 is a diagram of the waveform of a different control signal asserted during operation of the FIG. 2 circuit.

DETAILED DESCRIPTION OF THE PREFERRED EMBODIMENTS

Figure 2:
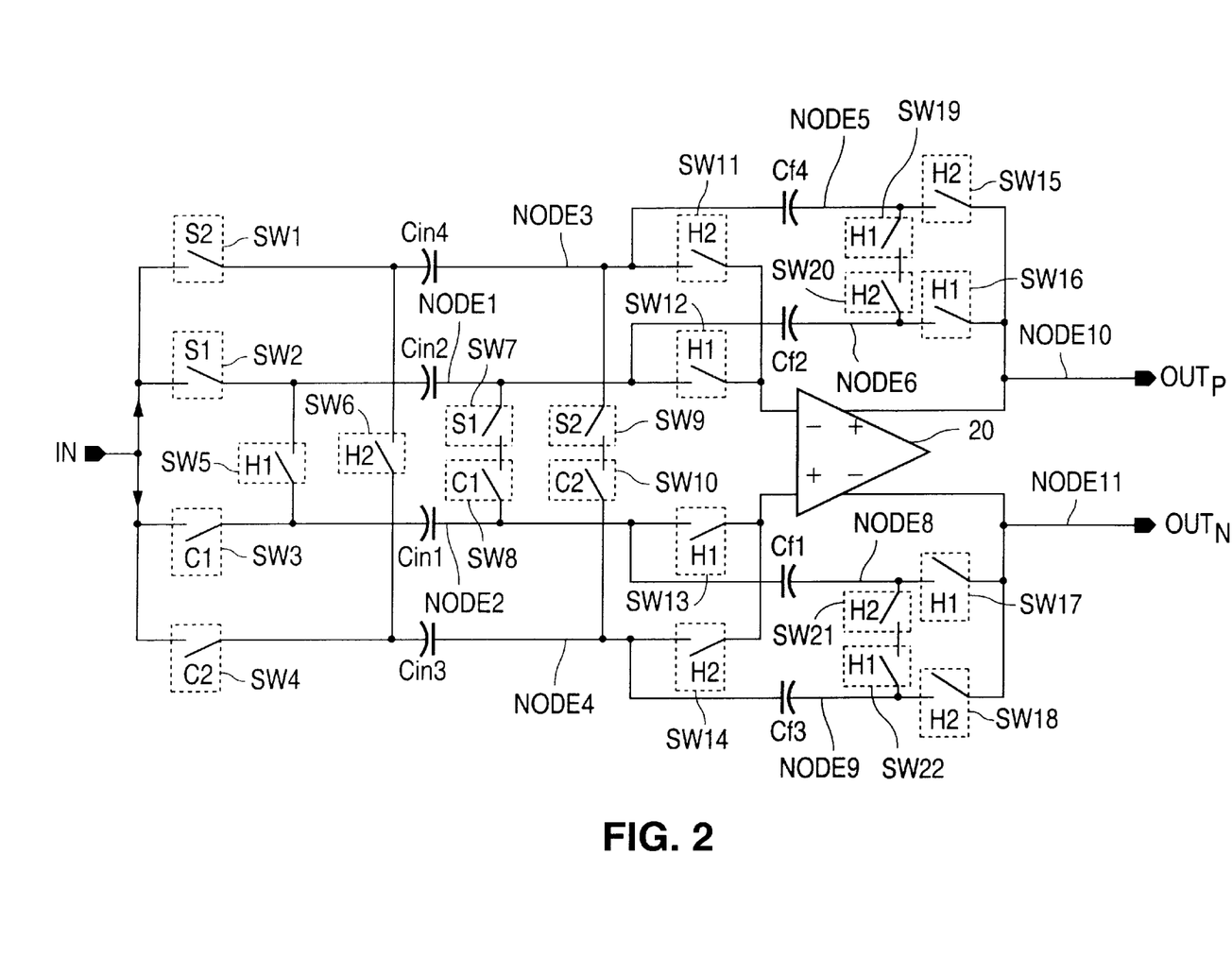
FIG. 2 is a schematic diagram of a preferred embodiment of the inventive correlated double sampler circuit.

FIG. 2 is simplified schematic diagram of a preferred embodiment of the inventive CDS circuit. The circuit of FIG. 2 comprises op amp 20 whose differential output ($OUT_P$–$OUT_N$) has a sequence of values, each value indicative of an amount of light (typically having a particular frequency or narrow range of frequencies) that has fallen on a different one of the pixels of a CCD image sensor coupled to the input node IN. Each value of the amplifier output is indicative of the difference between a signal level and a reset level associated with one such pixel. The FIG. 2 circuit also includes capacitor and switch circuitry (comprising switches SW1–SW22 and capacitors Cin1–Cin4 and Cf1–Cf4 connected as shown) coupled between the input node IN, the differential input of amplifier 20, and the differential output of amplifier 20. The capacitor and switch circuitry does not itself include any amplifier.

FIG. 3 is a diagram of the waveform of a raw output signal produced by a CCD image sensor. Such raw CCD sensor output signal is an example of the input signal (provided at node "IN" of FIG. 2) that is processed by the FIG. 2 circuit.

Figure 4:
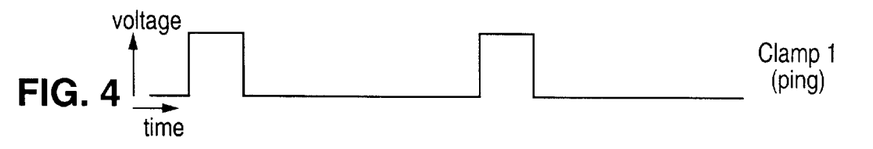
Figure 5:
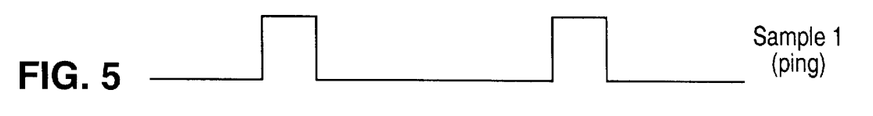
Figure 6:
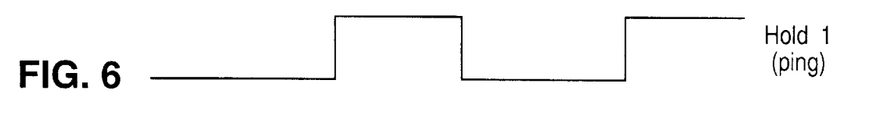
Figure 7:
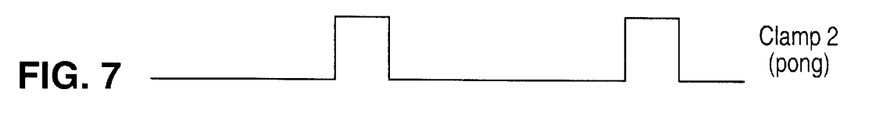
Figure 8:
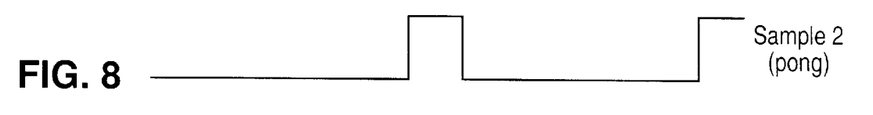
Figure 9:
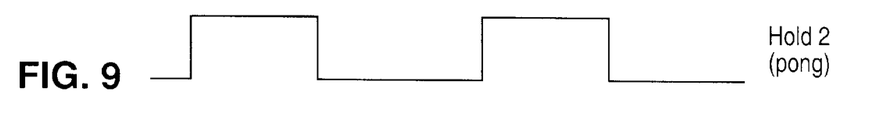

FIG. 4 is a diagram of the waveform of control signal C1 ("Clamp 1") asserted during operation of the FIG. 2 circuit, FIG. 5 is a diagram of the waveform of control signal S1 ("Sample 1") asserted during operation of the FIG. 2 circuit, FIG. 6 is a diagram of the waveform of control signal H1 ("Hold 1") asserted during operation of the FIG. 2 circuit, FIG. 7 is a diagram of the waveform of control signal C2 (Clamp 2) asserted during operation of the FIG. 2 circuit, FIG. 8 is a diagram of the waveform of control signal S2 (Sample 2) asserted during operation of the FIG. 2 circuit, and FIG. 9 is a diagram of the waveform of control signal H2 (Hold 2) asserted during operation of the FIG. 2 circuit.

With reference to FIG. 2, the input signal is asserted at input node IN from a CCD image sensor (not shown). Each of the switches labeled SW1, SW2, SW3, and SW4 has a first terminal coupled to the input node. Switch SW1 has a second terminal coupled to capacitor Cin4, switch SW2 has a second terminal coupled to capacitor Cin2, switch SW3 has a second terminal coupled to capacitor Cin1, and switch SW4 has a second terminal coupled to capacitor Cin3. Switch SW5 is connected between the second terminal of switch SW2 and the second terminal of switch SW3, switch SW6 is connected between the second terminal of switch SW1 and the second terminal of switch SW4, switches SW7 and SW8 are connected in series between Node 1 and Node 2, and switches SW9 and SW10 are connected in series between Node 3 and Node 4. A first terminal of switch SW11 is connected to Node 3, a first terminal of switch SW12 is connected to Node 1, a first terminal of switch SW13 is connected to Node 2, and a first terminal of switch SW14 is connected to Node 4.

A first terminal of capacitor Cf4 is connected to Node 3, a first terminal of capacitor Cf2 is connected to Node 1, a first terminal of capacitor Cf1 is connected to Node 2, and a first terminal of capacitor Cf3 is connected to Node 4. Switch SW15 is connected between a second terminal of capacitor Cf4 and output node 10, switch SW16 is connected between a second terminal of capacitor Cf2 and output node 10, switch SW17 is connected between a second terminal of capacitor Cf1 and output node 11, and switch SW18 is connected between a second terminal of capacitor Cf3 and output node 11. Switches SW19 and SW20 are connected in series between Node 5 and Node 6, and switches SW21 and SW22 are connected in series between Node 8 and Node 9. Preferably, capacitors Cf1 and Cf2 have identical capacitances and capacitors Cin1 and Cin2 have identical capacitances (but the capacitance of Cf1 need not be the same as that of Cin1 in all preferred embodiments).

Switches SW1, SW2, SW3, SW4, SW5, SW6, SW7, SW8, SW9, SW10, SW11, SW12, SW13, SW14, SW15, SW16, SW17, SW18, SW19, SW20, SW21, and SW22 are controlled by signals S2, S1, C1, C2, H1, H2, S1, C1, S2, C2, H2, H1, H1, H2, H2, H1, H1, H2, H1, H2, H2, and H1 respectively.

In operation, signals S1, S2, C1, C2, H1, and H2 initially have values which open all of switches SW1, SW2, SW3, SW4, SW5, SW6, SW7, SW8, SW9, SW10, SW11, SW12, SW13, SW14, SW15, SW16, SW17, SW18, SW19, and SW22. Then, a falling edge of signal C1 causes switches SW3 and SW8 to close. In response to the falling edge of signal C1, a sample of input signal at input node IN (indicative of the reset level of a first pixel) is sampled onto capacitor Cin1 while the right plate of Cin1 is held at a constant voltage (cmi). At the same time, the left plate of feedback capacitor Cf1 is held at the constant voltage (cmi) while its right plate is held at another constant voltage (cmo).

Then, a falling edge of signal S1 causes switches SW2 and SW7 to close. In response to the falling edge of signal S1, a sample of input signal at input node IN (indicative of the signal level of the first pixel) is sampled onto the left plate of capacitor Cin2 while the right plate of capacitor Cin2 is held at the constant voltage, cmi. At the same time, the left plate of feedback capacitor Cf2 is connected to the constant voltage cmi, while its right plate is held at the other constant voltage (cmo).

Then, a falling edge of signal H1 causes switches SW5, SW12, SW13, SW16, SW17, SW19, and SW22 to close. In response to the falling edge of signal H1, the right plates of capacitors Cin1 and Cin2 are connected to the input nodes of op amp 20 (which is a differential amplifier) and the left plates of capacitors Cin1 and Cin2 are shorted together. At the same time, feedback capacitors Cf1 and Cf2 are connected between the input and output nodes of the differential amplifier. Since charge must be conserved, and since the right plates of capacitors Cin1 and Cin2 and the left plates of capacitors Cf1 and Cf2 remain at the voltage level cmi, the difference between the output nodes of differential amplifier 20 must equal the difference between the reset level and the signal level of the first pixel, assuming that the capacitances are equal (i.e., Cin1=Cin2=Cf1=Cf2). If Cin1=Cin2 and Cf1=Cf2, but Cin1 is not equal to Cf1, there will be a gain associated with the circuit whose value is readily apparent to those of ordinary skill in the art.

After the falling edge of S1 and before the falling edge of H1, a falling edge of signal C2 causes switches SW4 and SW10 to close. In response to the falling edge of signal C2, a sample of input signal at input node IN (indicative of the reset level of a second pixel) is sampled onto capacitor Cin3 while the right plate of Cin3 is held at the constant voltage (cmi). At the same time, the left plate of feedback capacitor Cf3 is held at the constant voltage (cmi) while its right plate is held the other constant voltage (cmo).

After the falling edge of C2 but before the falling edge of H1, a falling edge of signal S2 causes switches SW1 and SW9 to close. In response to the falling edge of signal S2, a sample of input signal at input node IN (indicative of the signal level of the second pixel) is sampled onto the left plate of capacitor Cin4 while the right plate of capacitor Cin4 is held at the constant voltage, cmi. At the same time, the left plate of feedback capacitor Cf4 is connected to the constant voltage cmi, while its right plate is held at the other constant voltage (cmo).

Then, a falling edge of signal H2 causes switches SW6, SW11, SW14, SW15, SW18, SW20, and SW21 to close, and a rising edge of signal H1 causes switches SW5, SW12, SW13, SW16, SW17, SW19, and SW22 to open. In response to these transitions of signals H1 and H2, the right plates of capacitors Cin3 and Cin4 are connected to the input nodes of differential amplifier 20 and the left plates of capacitors Cin3 and Cin4 are shorted together. At the same time, feedback capacitors Cf3 and Cf4 are connected between the input and output nodes of the differential amplifier (and capacitors Cf1 and Cf2 are disconnected from the input and output nodes of the differential amplifier).

Since charge must be conserved, and since the right plates of capacitors Cin3 and Cin4 and the left plates of capacitors Cf3 and Cf4 remain at the voltage level cmi, the difference between the output nodes of differential amplifier 20 must equal the difference between the reset level and the signal level of the second pixel, assuming that the capacitances are equal (i.e., Cin3=Cin4=Cf3=Cf4).

Thus, the differential output ($OUT_P$–$OUT_N$) of amplifier 20 progresses from one difference signal to the next as the clocks H1 and H2 alternate (180 degrees out of phase with respect to each other).

In other words, the FIG. 2 circuit comprises:

a first capacitor branch (including SW2 and Cin2) configured to sample a reset level of an odd pixel of a raw sensor output signal in response to a first set of values of control signals S1, C1, H1, S2, C2, and H2;

a second capacitor branch (including SW3 and Cin1) configured to sample a signal level of the odd pixel in response to a second set of values of the control signals;

a third capacitor branch (including SW1 and Cin4) configured to sample a reset level of an even pixel of the raw sensor output signal in response to a third set of values of the control signals;

a fourth capacitor branch (including SW4 and Cin3) configured to sample a signal level of the even pixel in response to a fourth set of values of the control signals; and fifth switch and capacitor circuitry (the other elements of the FIG. 2 circuit, excluding amplifier 20) configured to assert the signal level of the odd pixel, the reset level of the odd pixel, and first feedback signals (through switches SW16 and SW17) from the output terminals of amplifier 20 to the input terminals of amplifier 20 in response to a fifth set of values of the control signals, and configured to assert the signal level of the even pixel, the reset level of the even pixel, and second feedback signals (through switches SW15 and SW18) from the output terminals of amplifier 20 to the input terminals of amplifier 20 in response to a sixth set of values of the control signals.

The differential output of amplifier 20 of FIG. 2 is typically amplified in a programmable gain amplifier (not shown in FIG. 2) and then provided to an analog-to-digital converter (not shown in FIG. 2). The FIG. 2 circuit can be implemented as an integrated circuit whose output is provided to an integrated circuit analog-to-digital converter, or the FIG. 2 circuit can be implemented as part of an integrated circuit which also includes an analog-to-digital converter.

The FIG. 2 circuit has a continuous differential output, in the sense that the differential output ($OUT_P$–$OUT_N$) of amplifier 20 does not periodically return to zero. In operating the circuit, it is not necessary to cancel amplifier offsets since the entire signal chain is in an offset adjusting feedback loop. The offsets remain the same for every input signal sample (including samples of both even and odd pixels), so that the circuit avoids offset differences between even samples and odd samples. As a consequence, the FIG. 2 circuit consumes low power during operation.

Figure 10:
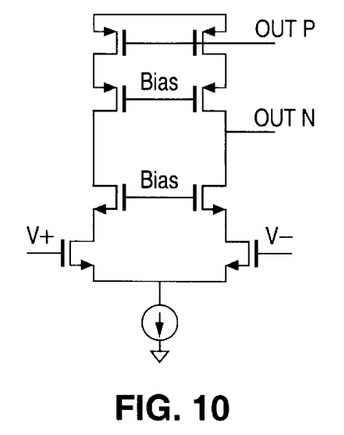
FIG. 10 is a schematic diagram of a CMOS implementation an op amp which is suitable (in some applications) for implementing the op amp of FIG. 2.

FIG. 10 is a schematic diagram of a CMOS implementation an op amp which is suitable (in some applications) for implementing differential amplifier 20 of FIG. 2. The FIG. 10 circuit comprises four NMOS transistors, four PMOS transistors, and a current sink, connected as shown.

Figure 11:
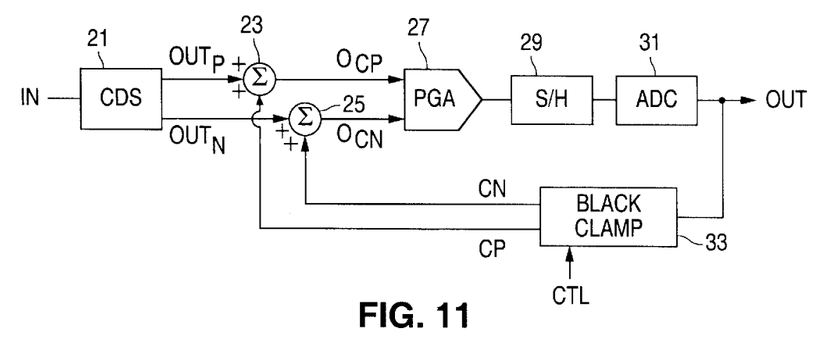
FIG. 11 is a block diagram of a circuit including the inventive correlated double sampler (element 21), an analog to digital converter (element 31), and black level correction circuitry (including element 33).

FIG. 11 is a block diagram of a circuit including correlated double sampler 21 (CDS 21 is an embodiment of the present invention, preferably the embodiment described above with reference to FIG. 2), programmable gain amplifier 27 which amplifies the corrected output of CDS 21 (the output of CDS 21 is corrected by units 23 and 25 in a manner to be described), sample and hold unit 29 (which is controlled to sample and hold the output of amplifier 27), analog to digital converter 31 (which converts samples of the analog output of amplifier 27 to digital signals), and black level correction circuitry (including addition units 23 and 25, and black clamp circuit 33), connected as shown. The black level correction circuitry implements a loop which provides feedback to set the differential output signal of CDS 21 to a known value for CCD pixel outputs of zero value (black).

Black clamp circuit 33 receives the digitized output (OUT) of A-to-D converter 31, and operates in response to control signals CTL to integrate the differences between portions of this digitized output indicative of black pixels (i.e., portions which correspond to masked portions of the CCD sensor) and a desired reference level, and generate a differential analog signal (a correction signal) indicative of the output of the integration. Circuit 33 also applies inverse gain (i.e., inverse to the gain applied by amplifier 27) to the output of the integration operation, so that the level of the correction signal does not depend on the gain applied by amplifier 27. The correction signal is a differential signal comprising analog signal CP and analog signal CN. Signal CP is fed back to one input of addition unit 23, and signal CN is fed back to one input of addition unit 25. Units 23 and 25 correct the differential output ($OUT_P$–$OUT_N$) of CDS 21 by generating corrected differential output signal $O_{CP}$–$O_{CN}$, where the level of $O_{CP}$ is $OUT_P$+CP and the level of $O_{CN}$ is $OUT_N$+CN.

The FIG. 11 circuit can be implemented as an integrated circuit, or as part of an integrated circuit.

Figure 12:
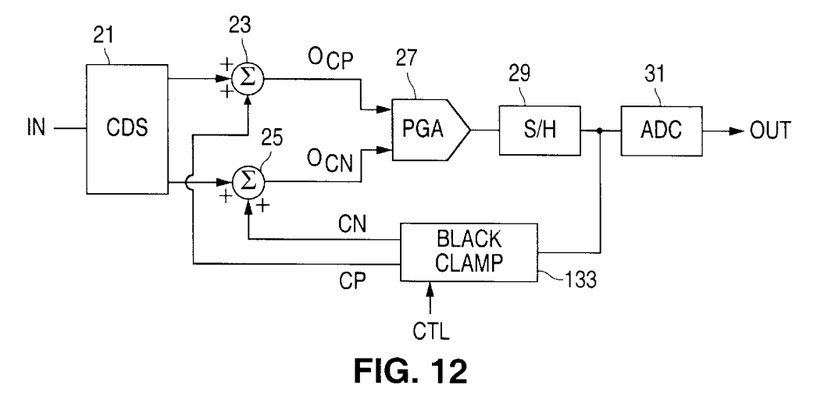
FIG. 12 is a block diagram of a variation on the circuit of FIG. 11.

In variations on the FIG. 11 circuit, the black level correction circuitry is implemented in any of a number of alternative ways. For example, a first one of such variations (shown in FIG. 12) differs from the FIG. 11 only in that the black level correction feedback loop is accomplished with analog circuitry. Elements 21, 23, 25, 27, 29, and 31 of the FIG. 12 circuit are identical to the identically numbered elements in FIG. 11. In FIG. 12, black clamp circuit 33 is replaced by analog black clamp circuit 133 which receives the analog input to A-to-D converter 31 (rather than the output of the A-to-D converter), and performs (with analog circuitry) analog counterparts to the described operations performed by black clamp circuit 33. In the FIG. 12 embodiment, the black level correction circuitry is implemented entirely with analog circuitry.

In another variation, black clamp circuit 33 generates a single analog output signal (rather than two analog output signals which together determine a differential output signal), and circuits 23 and 25 are replaced by a circuit (at the input of CDS 21) which adds this single analog output signal to the raw CCD signal. In a third variation, black clamp circuit 33 of FIG. 11 is replaced by a circuit which receives the analog input to A-to-D converter 31, performs (with analog circuitry) analog counterparts to the described operations performed by black clamp circuit 33 to generate a single analog output signal (rather than two analog output signals which together determine a differential output signal), and circuits 23 and 25 are replaced by a circuit (at the input of CDS 21) which adds this single analog output signal to the raw CCD signal.

Although only preferred embodiments have been described in detail herein, those having ordinary skill in the art will certainly understand that many modifications are possible without departing from the teachings hereof. All such modifications are intended to be encompassed within the following claims.

What is claimed is:

1. A correlated double sampler circuit which operates cyclically to process a raw sensor output signal from a CCD image sensor to generate an image signal indicative of a sensed image, said circuit including:

an input node coupled to receive the raw sensor output signal;

a first amplifier having two input terminals and two output terminals; and switch and capacitor circuitry comprising switches and capacitors but not an amplifier, wherein the switch and capacitor circuitry is coupled between the input node, the input terminals of the first amplifier, and the output terminals of the first amplifier, the switch and capacitor circuitry is coupled to receive a first set of control signals followed by a second set of control signals during each cycle of operation of the correlated double sampler circuit, and the switch and capacitor circuitry is configured to operate cyclically during processing of the raw sensor output signal such that a portion of the image signal generated in response to the first set of control signals is indicative of the value of one pixel of the image and a subsequent portion of the image signal generated in response to the second set of control signals is indicative of the value of a next pixel of the image.

2. The correlated double sampler circuit of claim 1, wherein the first amplifier is an op amp, and the image signal is a differential output signal produced at the output terminals of the op amp.

3. The correlated double sampler circuit of claim 1, wherein the switch and capacitor circuitry comprises:

a first capacitor branch coupled to the input node and configured to sample a reset level of an odd pixel of the raw sensor output signal in response to a first set of values of the control signals;

a second capacitor branch coupled to the input node and configured to sample a signal level of the odd pixel of the raw sensor output signal in response to a second set of values of the control signals;

a third capacitor branch coupled to the input node and configured to sample a reset level of an even pixel of the raw sensor output signal in response to a third set of values of the control signals;

a fourth capacitor branch coupled to the input node and configured to sample a signal level of the even pixel of the raw sensor output signal in response to a fourth set of values of the control signals; and fifth switch and capacitor circuitry coupled to the input terminals of the first amplifier, the output terminals of the first amplifier, the first capacitor branch, and the second capacitor branch, configured to assert the signal level of the odd pixel, the reset level of the odd pixel, and first feedback signals from the output terminals of the first amplifier to the input terminals of the first amplifier in response to a fifth set of values of the control signals, and configured to assert the signal level of the even pixel, the reset level of the even pixel, and second feedback signals from the output terminals of the first amplifier to the input terminals of the first amplifier in response to a sixth set of values of the control signals.

4. The correlated double sampler circuit of claim 1, wherein the first set of control signals consists of a first clamp signal, a first sample signal, and a first hold signal, the second set of control signals consists of a second clamp signal, a second sample signal, and a second hold signal, and the switch and capacitor circuitry comprises:

a first branch comprising a first switch coupled to the input node, a second switch coupled to a first input of the first amplifier, and a first capacitor coupled to the first switch at a first node and to the second switch at a second node, wherein the first switch is coupled to receive the second sample signal and the second switch is coupled to receive the second hold signal;

a second branch comprising a third switch coupled to the input node, a fourth switch coupled to the first input of the first amplifier, and a second capacitor coupled to the third switch at a third node and to the fourth switch at a fourth node, wherein the third switch is coupled to receive the first sample signal and the fourth switch is coupled to receive the first hold signal;

a third branch comprising a fifth switch coupled to the input node, a sixth switch coupled to a second input of the first amplifier, and a third capacitor coupled to the fifth switch at a fifth node and to the sixth switch at a sixth node, wherein the fifth switch is coupled to receive the first clamp signal and the sixth switch is coupled to receive the first hold signal; and a fourth branch comprising a seventh switch coupled to the input node, am eighth switch coupled to the second input of the first amplifier, and a fourth capacitor coupled to the seventh switch at a seventh node and to the eighth switch at an eighth node, wherein the seventh switch is coupled to receive the second clamp signal and the eighth switch is coupled to receive the second hold signal.

5. The correlated double sampler circuit of claim 4, wherein the switch and capacitor circuitry also comprises:

a ninth switch coupled between the third node and the fifth node, wherein the ninth switch is coupled to receive the first hold signal;

a tenth switch coupled between the first node and the seventh node, wherein the tenth switch is coupled to receive the second hold signal;

an eleventh switch and a twelfth switch coupled in series between the second node and the eighth node, wherein the eleventh switch is coupled to receive the second sample signal and the twelfth switch is coupled to receive the second clamp signal; a thirteenth and a fourteenth switch coupled in series between the fourth node and the sixth node, wherein the thirteenth switch is coupled to receive the first sample signal and the fourteenth switch is coupled to receive the first clamp signal.

6. The correlated double sampler circuit of claim 4, wherein the switch and capacitor circuitry also comprises:

a ninth switch coupled between the third node and the fifth node, wherein the ninth switch is coupled to receive the first hold signal;

a tenth switch coupled between the first node and the seventh node, wherein the tenth switch is coupled to receive the second hold signal;

a switch means coupled between the second node and the eighth node, wherein the switch means is coupled to receive the second sample signal and the second clamp signal; and a second switch means coupled between the fourth node and the sixth node, wherein the second switch means is coupled to receive the first sample signal and the first clamp signal.

7. The correlated double sampler circuit of claim 6, wherein the switch and capacitor circuitry also comprises:
   a fifth capacitor coupled between the second node and a ninth node and an eleventh switch coupled between the ninth node and a first output terminal of the first amplifier, wherein the eleventh switch is coupled to receive the second hold signal;
   a sixth capacitor coupled between the fourth node and a tenth node and a twelfth switch coupled between the tenth node and the first output terminal of the first amplifier, wherein the twelfth switch is coupled to receive the first hold signal;
   a seventh capacitor coupled between the sixth node and an eleventh node and a thirteenth switch coupled between the eleventh node and a second output terminal of the first amplifier, wherein the thirteenth switch is coupled to receive the first hold signal;
   a eighth capacitor coupled between the eighth node and a twelfth node and a fourteenth switch coupled between the twelfth node and the second output terminal of the first amplifier, wherein the fourteenth switch is coupled to receive the second hold signal;
   a third switch means coupled between the ninth node and the tenth node, wherein the third switch means is coupled to receive the first hold signal and the second hold signal; and
   a fourth switch means coupled between the eleventh node and the twelfth node, wherein the fourth switch means is coupled to receive the first hold signal and the second hold signal.

8. The correlated double sampler circuit of claim 7, wherein the third switch means comprises:
   a fifteenth switch and a sixteenth switch coupled in series between the ninth node and the tenth node, wherein the fifteenth switch is coupled to receive the first hold signal and the sixteenth switch is coupled to receive the second hold signal; a seventeenth and an eighteenth switch coupled in series between the eleventh node and the twelfth node, wherein the seventeenth switch is coupled to receive the first hold signal and the eighteenth switch is coupled to receive the second hold signal.

9. A circuit for processing a raw sensor output signal from a CCD image sensor to generate an image signal indicative of a sensed image, said circuit including:
   a correlated double sampler having an input node coupled to receive the raw sensor output signal, wherein the correlated double sampler is configured to operate cyclically to process the raw sensor output signal to produce an analog image signal;
   a programmable gain amplifier coupled to receive the analog image signal and configured to produce from the analog image signal an amplified analog image signal; and
   analog-to-digital conversion circuitry, coupled to receive the amplified analog image signal and configured to convert a sequence of samples of the amplified analog image signal into the image signal such that said image signal comprises digital data,
   wherein the correlated double sampler includes switch and capacitor circuitry and a first amplifier, wherein the first amplifier has two input terminals and at least one output terminal, the switch and capacitor circuitry comprises switches and capacitors but not an amplifier, the switch and capacitor circuitry is coupled between the input node, the input terminals of the first amplifier, and each said output terminal of the first amplifier, the switch and capacitor circuitry is coupled to receive a first set of control signals followed by a second set of control signals during each cycle of operation of the correlated double sampler, and the switch and capacitor circuitry is configured to operate cyclically during processing of the raw sensor output signal such that a portion of the analog image signal produced at said at least one output terminal in response to the first set of control signals is indicative of the value of one pixel of the image and a subsequent portion of the analog image signal produced at said at least one output terminal in response to the second set of control signals is indicative of the value of a next pixel of the image.

10. The circuit of claim 9, also including:
    a single black level correction feedback loop coupled to at least one of the input node and the first amplifier.

11. The circuit of claim 10, wherein the black level correction feedback loop includes:
    a black clamp circuit having an input and at least one output node, wherein the input is coupled to receive the image signal produced by the analog-to-digital conversion circuitry, and the black clamp circuit is configured to produce a black level correction signal at said at least one output node in response to the image signal; and
    an addition circuit having inputs coupled to the first amplifier and to said at least one output node of the black clamp circuit, and having at least one output, wherein the at least one output of the addition circuit is the at least one output terminal of the first amplifier.

12. The circuit of claim 10, wherein the first amplifier is an op amp having two output nodes, the first amplifier has two output terminals, and the analog image signal is a differential output signal produced at the output terminals of the first amplifier.

13. The circuit of claim 12, wherein the black level correction feedback loop includes:
    a black clamp circuit having an input and two output nodes, wherein the input is coupled to receive the image signal produced by the analog-to-digital conversion circuitry, and the black clamp circuit is configured to produce a differential black level correction signal at the output nodes in response to the image signal; and
    addition circuitry having inputs coupled to the output nodes of the op amp and to the output nodes of the black clamp circuit and having outputs, wherein the outputs of the addition circuitry are the output terminals of the first amplifier.

14. The circuit of claim 10, wherein the black level correction feedback loop includes:
    analog black clamp circuitry having an input and at least one output, wherein the input is coupled to receive samples of the analog image signal, and the analog black clamp circuitry asserts a black level correction signal at the at least one output of said analog black clamp circuitry; and
    an addition circuit having inputs coupled to the first amplifier and to said at least one output node of the analog black clamp circuitry, and having at least one output, wherein the at least one output of the addition circuit is the at least one output terminal of the first amplifier.

15. The circuit of claim 9, wherein the first amplifier is an op amp having two output terminals and two input terminals, and wherein the input terminals of the op amp are said input terminals of the first amplifier.

16. The circuit of claim 15, wherein the switch and capacitor circuitry comprises:

a first capacitor branch coupled to the input node and configured to sample a reset level of an odd pixel of the raw sensor output signal in response to a first set of values of the control signals;

a second capacitor branch coupled to the input node and configured to sample a signal level of the odd pixel of the raw sensor output signal in response to a second set of values of the control signals;

a third capacitor branch coupled to the input node and configured to sample a reset level of an even pixel of the raw sensor output signal in response to a third set of values of the control signals;

a fourth capacitor branch coupled to the input node and configured to sample a signal level of the even pixel of the raw sensor output signal in response to a fourth set of values of the control signals; and fifth switch and capacitor circuitry coupled to the input terminals of the op amp, the output terminals of the op amp, the first capacitor branch, and the second capacitor branch, configured to assert the signal level of the odd pixel, the reset level of the odd pixel, and first feedback signals from the output terminals of the op amp to the input terminals of the op amp in response to a fifth set of values of the control signals, and configured to assert the signal level of the even pixel, the reset level of the even pixel, and second feedback signals from the output terminals of the op amp to the input terminals of the op amp in response to a sixth set of values of the control signals.

17. A correlated double sampler circuit which operates cyclically to process a raw sensor output signal from an image sensor to generate an image signal indicative of a sensed image, said circuit including:

an input node coupled to receive the raw sensor output signal;

a first amplifier having two input terminals and two output terminals; and switch and capacitor circuitry comprising switches and capacitors but not an amplifier, wherein the switch and capacitor circuitry is coupled between the input node, the input terminals of the first amplifier, and the output terminals of the first amplifier, the switch and capacitor circuitry is coupled to receive a first set of control signals followed by a second set of control signals during each cycle of operation of the correlated double sampler circuit, and the switch and capacitor circuitry is configured to operate cyclically during processing of the raw sensor output signal such that a portion of the image signal generated in response to the first set of control signals is indicative of the value of one pixel of the image and a subsequent portion of the image signal generated in response to the second set of control signals is indicative of the value of a next pixel of the image.

18. The correlated double sampler circuit of claim 17, wherein the first amplifier is an op amp, and the image signal is a differential output signal produced at the output terminals of the op amp.

19. A circuit for processing a raw sensor output signal from an image sensor to generate an image signal indicative of a sensed image, said circuit including:

a correlated double sampler having an input node coupled to receive the raw sensor output signal, wherein the correlated double sampler is configured to operate cyclically to process the raw sensor output signal to produce an analog image signal;

a programmable gain amplifier coupled to receive the analog image signal and configured to produce from the analog image signal an amplified analog image signal; and analog-to-digital conversion circuitry, coupled to receive the amplified analog image signal and configured to convert a sequence of samples of the amplified analog image signal into the image signal such that said image signal comprises digital data, wherein the correlated double sampler includes switch and capacitor circuitry and a first amplifier, wherein the first amplifier has two input terminals and at least one output terminal, the switch and capacitor circuitry comprises switches and capacitors but not an amplifier, the switch and capacitor circuitry is coupled between the input node, the input terminals of the first amplifier, and each said output terminal of the first amplifier, the switch and capacitor circuitry is coupled to receive a first set of control signals followed by a second set of control signals during each cycle of operation of the correlated double sampler, and the switch and capacitor circuitry is configured to operate cyclically during processing of the raw sensor output signal such that a portion of the analog image signal produced at said at least one output terminal in response to the first set of control signals is indicative of the value of one pixel of the image and a subsequent portion of the analog image signal produced at said at least one output terminal in response to the second set of control signals is indicative of the value of a next pixel of the image.

20. The circuit of claim 19, wherein the first amplifier is an op amp having two output terminals and two input terminals, and wherein the input terminals of the op amp are said input terminals of the first amplifier.

21. The circuit of claim 19, also including:

a single black level correction feedback loop coupled to at least one of the input node and the first amplifier.

* * * * *

UNITED STATES PATENT AND TRADEMARK OFFICE
CERTIFICATE OF CORRECTION

PATENT NO.     : 6,587,143 B1
DATED          : July 1, 2003
INVENTOR(S)    : David M. Boisvert It is certified that error appears in the above-identified patent and that said Letters Patent is hereby corrected as shown below:

Column 10,
Line 29, "am eighth" should be -- an eighth --.
Line 48, insert -- and -- before "a thirteenth".

Column 11,
Line 41, insert -- and -- before "a seventeenth".

Signed and Sealed this

Seventh Day of October, 2003

JAMES E. ROGAN
*Director of the United States Patent and Trademark Office*